(12) United States Patent
Komori

(10) Patent No.: US 6,480,012 B1
(45) Date of Patent: Nov. 12, 2002

(54) PROBE CARD DEVICE

(75) Inventor: Junko Komori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/484,411

(22) Filed: Jan. 18, 2000

(30) Foreign Application Priority Data

Jun. 21, 1999 (JP) .............................. 11-173832

(51) Int. Cl.⁷ .............................................. G01R 31/02
(52) U.S. Cl. ...................... 324/754; 324/758; 324/158.1
(58) Field of Search ................. 324/754, 758, 324/158.1

(56) References Cited

U.S. PATENT DOCUMENTS

| | | | | |
|---|---|---|---|---|
| 5,521,523 A | * | 5/1996 | Kimura et al. | 324/754 |
| 5,604,446 A | * | 2/1997 | Sano | 324/754 |
| 5,804,983 A | * | 9/1998 | Nakajima et al. | 324/754 |
| 5,831,441 A | * | 11/1998 | Motooka et al. | 324/754 |
| 6,005,401 A | * | 12/1999 | Nakata et al. | 324/754 |
| 6,040,700 A | * | 3/2000 | Berar | 324/754 |
| 6,060,892 A | * | 5/2000 | Yamagata | 324/754 |
| 6,084,215 A | * | 7/2000 | Furuya et al. | 324/760 |
| 6,107,813 A | * | 8/2000 | Sinsheimer et al. | 324/754 |
| 6,215,321 B1 | * | 4/2001 | Nakata | 324/754 |
| 6,246,251 B1 | * | 6/2001 | Gallagher | 324/765 |
| 6,265,888 B1 | * | 7/2001 | Hsu | 324/754 |

FOREIGN PATENT DOCUMENTS

| | | | |
|---|---|---|---|
| JP | 05206233 A | * | 8/1993 |
| JP | 06281671 A | * | 10/1994 |
| JP | 8-148533 | | 6/1996 |
| JP | 9-17831 | | 1/1997 |

* cited by examiner

Primary Examiner—Michael Sherry
Assistant Examiner—Jermele Hollington
(74) Attorney, Agent, or Firm—McDermott, Will & Emery

(57) ABSTRACT

A probe card device having an insulator board and a plurality of bumps includes a probe card wafer formed of the same material as that of a wafer under test. Probe card wafer is provided with a spacer to seal between the wafer under test and probe card wafer in order to hold the wafer under test by vacuum, and a wafer through hole for evacuation. Thus, a probe card device having a probe card wafer which can be surely electrically connected with pads of a plurality of semiconductor devices formed in a semiconductor substrate under test can be provided.

21 Claims, 14 Drawing Sheets

PROBE CARD DEVICE

BACKGROUND OF THE INVENTION

1. Field of the Invention

The present invention relates generally to probe card devices, and more particularly, to a probe card device which can test a plurality of semiconductor devices as they are formed on a wafer.

2. Description of the Background Art

Semiconductor devices are operated with higher power supply voltage than the normal level in use or in a more severe peripheral temperature condition than the normal temperature condition or maintained in a higher temperature condition for testing before shipment, so that devices with the possibility of causing initial failures could be removed. The test conducted for the purpose of improving the reliability of the semiconductor devices is called "burn-in".

A conventional burn-in device for a burn-in test will be now described. The burn-in devices are divided into those for a burn-in test a semiconductor device formed in a wafer and those for testing of such semiconductor devices formed in a wafer in an assembled arrangement.

Herein, the former burn-in device will be described. Referring to FIG. 17, a wafer under test 101 having a semiconductor device formed thereon is placed at a wafer prober 105. A burn-in board 102 is provided opposing to wafer under test 101. Burn-in board 102 is electrically connected to a test head 106 and a tester 108 through a signal cable 107.

Referring to FIG. 18, burn-in board 102 is provided with a plurality of board needles 103 respectively to be connected with a plurality of electrodes (pads) formed in the semiconductor device and a board connect pin 104 electrically connected to the test head 106.

Referring to FIG. 19, in order to improve the processing performance in a burn-in test, a burn-in board 102 having a plurality of sets of board needles series 103 corresponding to individual semiconductor devices is used. The conventional burn-in device has the construction as described above.

The conventional burn-in unit suffers from the following problems. Burn-in board 102 is formed of glass epoxy resin or polyimide resin or the like, while wafer under test 101 is typically formed of silicon, and the materials of these elements have different thermal expansion coefficients.

As a result, if the temperature is raised in a burn-in test, the difference in the thermal expansion coefficients of the materials of burn-in board 102 and wafer under test 101 sometimes causes board needle 103 to shift from a prescribed pad in the semiconductor device in the surface of wafer under test 101.

The difference in the warps of burn-in board 102 and wafer under test 101 sometimes causes board needle 103 to be detached from the pad in the semiconductor device, and a burn-in test cannot be successfully carried out.

SUMMARY OF THE INVENTION

The present invention is directed to a solution to the above-described problems, and it is one object of the present invention to provide a probe card device which can surely touch a prescribed electrode in a semiconductor device formed in a semiconductor substrate under test and successfully carry out a burn-in test.

The probe card device according to the present invention for testing a plurality of semiconductor devices formed on a substrate under test includes a probe substrate opposing the substrate under test and having a plurality of probe electrodes in electrical contact with the semiconductor devices and formed of the same material as that of the substrate under test. The probe substrate has a first seal member and a substrate through hole. The first seal member is provided on one surface opposing the substrate under test to hold the substrate under test by vacuum and seal between the substrate under test and the probe substrate. The substrate through hole is formed through the probe substrate for evacuation.

Thus, the probe substrate formed of the same material as that of the substrate under test has the same expansion coefficient as that of the substrate under test. As a result, if the temperature is raised in a test, a plurality of probe electrodes formed in the probe substrate and prescribed electrodes in the semiconductor device formed on the substrate under test corresponding to the probe electrodes will not be relatively shifted from one another. As a result, the probe electrodes and the prescribed electrodes surely come into contact, so that the semiconductor device may be surely tested.

A film is preferably provided at the other surface of the probe substrate to match the warps of the probe substrate and the substrate under test in testing.

In this case, the spacing between the probe substrate and the substrate under test will be substantially constant within the surface of the substrate under test. As a result, the plurality of probe electrodes formed in the probe substrate and the electrodes of the semiconductor device will not be departed from one another, so that they come into contact even more surely.

A plurality of patterns segmented by dicing lines are formed on the one surface of the probe substrate and the substrate through hole is formed in the region of the dicing lines.

In this case, the substrate under test is held by vacuum, and therefore the streaming resistance at the time of exhausting the space between the probe substrate and the substrate under test is relaxed, so that even evacuation may be efficiently achieved. As a result, the substrate under test can be evenly adsorbed.

The size of one shot pattern is preferably different from the size of one shot for the semiconductor device formed in the substrate under test.

In this case, the probe electrodes in the probe substrate can be surely brought into contact with prescribed electrodes in the semiconductor device formed in the substrate under test. More specifically, if the substrate under test is curved to form convex toward the side opposing the side of the probe substrate, the size of one shot pattern may be set smaller than that of the semiconductor device, so that the electrodes in the substrates can be surely brought into contact. Meanwhile, if the substrate under test is curved to form convex toward the side of the probe substrate, the size of one shot pattern may be set larger than that of the semiconductor device, so that the electrodes can be surely brought into contact.

The pattern of the probe substrate preferably has at least two interconnection layers.

In this case, the flexibility of the pattern formed in the probe substrate is improved. Sufficient current may be stably supplied for testing the semiconductor device.

The pattern of the probe substrate includes a prescribed circuit portion pattern for use in testing the substrate under test. The prescribed circuit portion pattern includes a power supply generating circuit, a clock signal generating circuit, a test circuit or a counter circuit.

Thus, defects in a particular part of the semiconductor device may be found early and the semiconductor device may be operated at a high speed. Thus, semiconductor devices with the possibility of causing initial failures may be removed in earlier stages. Data on the failure percentage or defective positions may be collected to alleviate the quality control of the semiconductor devices.

The probe electrode formed in the probe substrate preferably includes a bump electrode.

Thus, damages to prescribed electrodes in a semiconductor device formed in the substrate under test may be restrained. As a result, if a pad electrode to be wire-bonded is applied as a prescribed electrode in a semiconductor device, failures in wire-bonding to the pad electrode may be reduced.

The first seal member formed in the probe substrate preferably includes a ring-shaped insulating film formed around the outer periphery of the probe substrate.

Thus, the ring-shaped insulating film comes into contact with the vicinity of the outer periphery of the substrate under test, and the substrate under test may be surely adsorbed by vacuum.

The probe substrate preferably has at least two substrate side alignment marks on the side of the probe substrate corresponding to alignment marks formed in the semiconductor device for alignment with the substrate under test.

Thus, when the substrate under test is held by vacuum, the probe substrate may be readily positioned with respect to the substrate under test.

The size of the substrate side alignment marks is preferably different from the size of the alignment marks formed in the semiconductor device, and alignment marks larger among those formed on the side of the substrate and semiconductor device are formed of a material which reflects infrared radiation and the smaller marks are formed of a material opaque or semitransparent to infrared radiation.

Thus, an infrared beam is used for scanning, and a beam reflected from the larger size alignment marks is measured. Then, based on the position at which this reflected beam is shielded by the smaller size alignment marks, the positioning of the probe substrate relative to the substrate under test can be readily achieved.

An insulator board opposing the other surface of the probe substrate is preferably provided. At least one of the insulator board and the opposing surface of the probe substrate is provided with a second seal member to seal between the probe board and the insulator board in order to held the probe substrate and substrate under test by vacuum, and the insulator board has a board through hole to evacuate the substrate under test through the substrate through hole.

Thus, the probe substrate is placed between the insulator board and the substrate under test for testing. At this time, a cable connected to a tester necessary for testing can be connected to the insulator board without being directly connected to the probe board, and therefore the probe can be more readily handled.

A groove is preferably formed at the surface of the insulator board surrounded by the second seal member.

Thus, the substrate under test is adsorbed by vacuum through the probe substrate, the streaming resistance present at the time of exhausting the space between the insulator board and the probe substrate is relaxed, and evacuation can be evenly performed, so that the probe substrate and the substrate under test can be evenly adsorbed.

The second seal member preferably includes a substrate side ring-shaped electrode formed along the outer periphery of the probe substrate, and a board side ring-shaped electrode formed in the insulator board and in contact with the substrate side ring-shaped electrode.

Thus, sealing may be achieved with both ring-shaped electrodes, and a member only for sealing does not have to be provided at the probe substrate or the insulator board.

The probe substrate preferably has a substrate side electrode in electrical contact with the probe electrode, and the insulator board has a board side electrode in contact with the substrate side electrode.

Thus, the cable of the test device is electrically connected with a plurality of probe electrodes provided at the probe substrate through the board side electrode and the substrate side electrode, plurality of such substrate side electrodes are radially provided along the outer periphery of the probe substrate, and a plurality of such board side electrodes are radially provided along the outer periphery of the insulator board.

Thus, if the probe substrate and insulator board thermally expand as the temperature rises in testing, they expand radially, so the relative positional shift among the electrodes can be absorbed, and a sure contact state can be maintained.

As the substrate side electrodes, electrodes formed continuously from one surface of the probe substrate via the periphery to the other surface are preferable. The substrate-side electrode is electrically connected to a cable coated with an insulator, and the cable coated with the insulator is preferably electrically connected with the electrode through the through hole formed at the outer periphery of the probe substrate.

A tapered surface is provided at the outer periphery of the probe substrate on the side of the insulator board, the substrate side electrode is formed at the tapered surface, a wire is bonded to the substrate side electrode, and the wire is electrically connected to the electrode.

Thus, when the probe substrate and the insulator board are in contact, the wire-bonded part can be prevented from directly contacting the insulator board.

The foregoing and other objects, features, aspects and advantages of the present invention will become more apparent from the following detailed description of the present invention when-taken in conjunction with the accompanying drawings.

DESCRIPTION OF THE PREFERRED EMBODIMENTS

First Embodiment

Figure 1A:
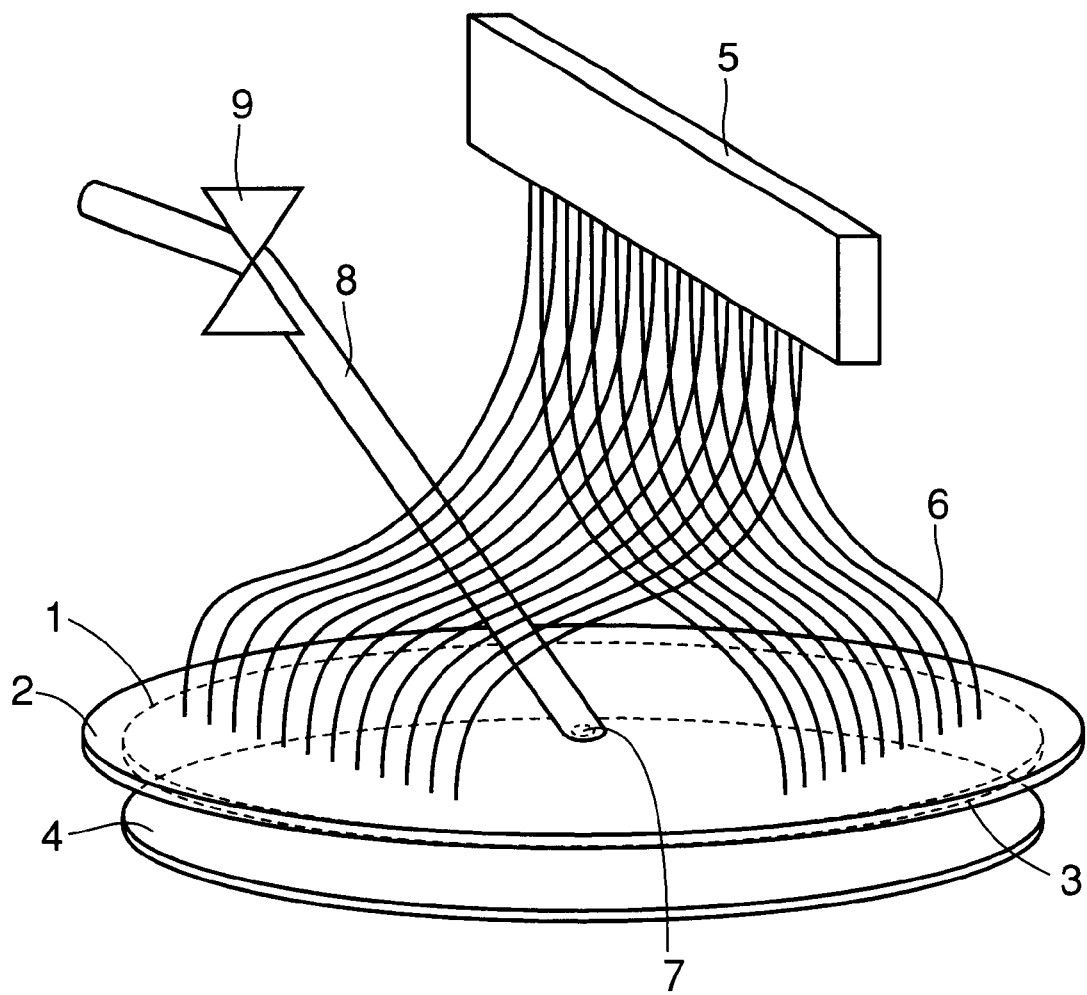
FIG. 1a is a perspective view of a burn-in device according to a first embodiment of the present invention.
Figure 1B:
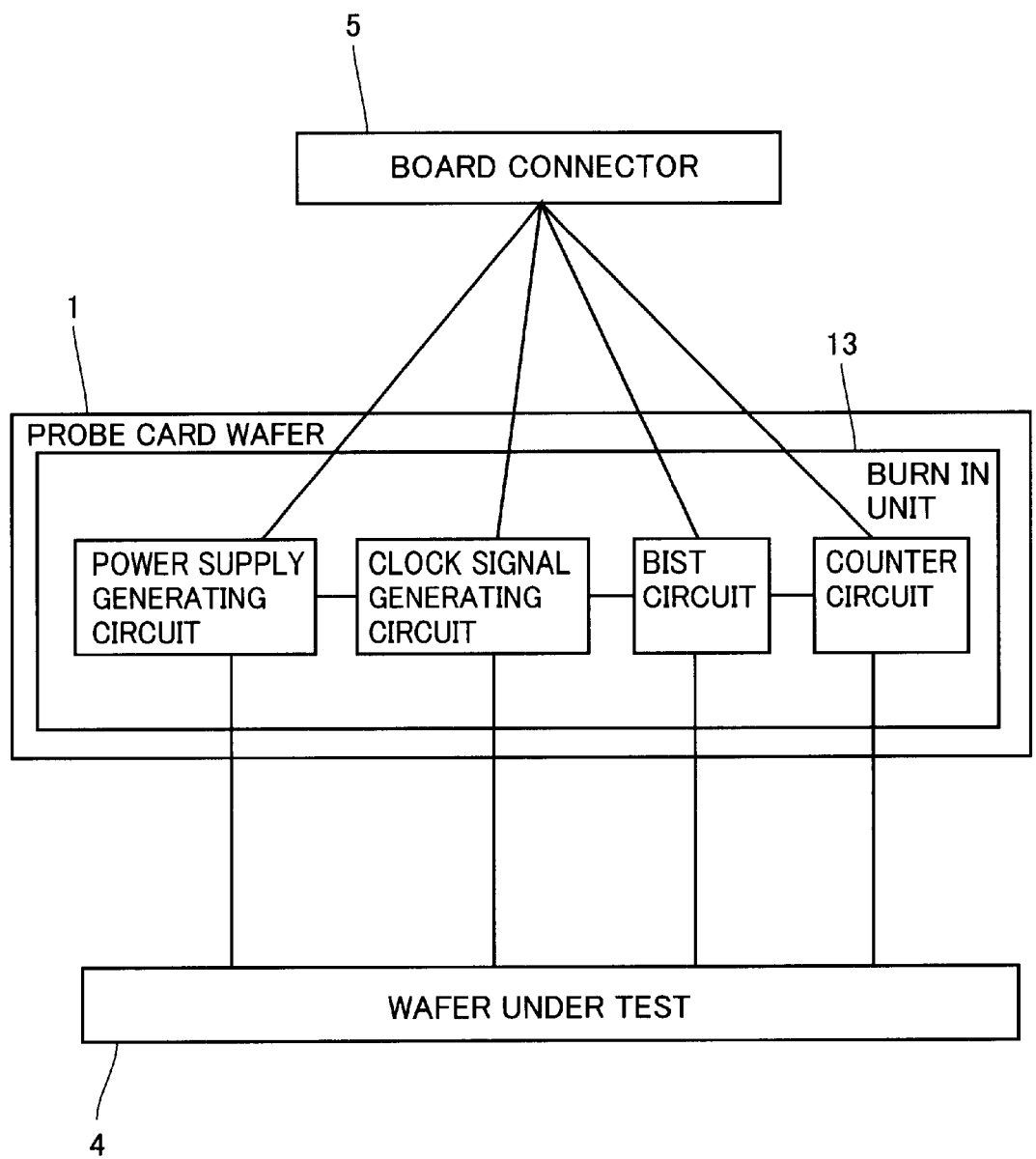
FIG. 1b illustrates in block form electrical circuits used with the present invention.
Figure 2:
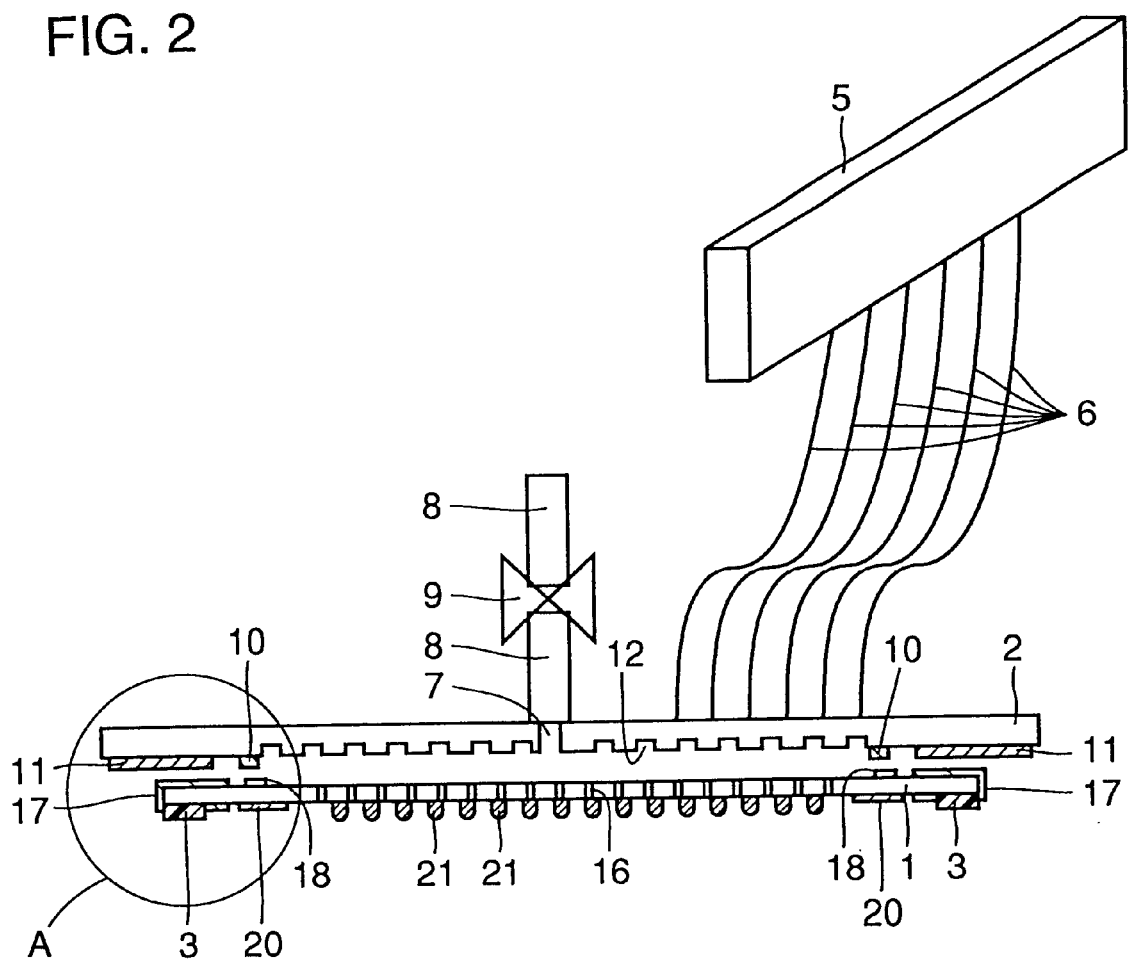
FIG. 2 is a cross sectional view of the burn-in device according to the embodiment.

A burn-in device including a probe card device according to a first embodiment of the present invention will be now described in conjunction with the accompanying drawings. As shown in FIGS. 1 and 2, a probe card wafer 1 of the same material as that of a wafer under test 4 is formed opposing wafer under test 4 having a plurality of semiconductor devices. If for example wafer under test 4 is a silicon wafer, probe card wafer 1 is also formed of a silicon wafer. An insulator board 2 is provided opposing wafer under test 4 through probe card wafer 1.

Insulator board 2 is provided with a board through hole 7, at a part of which a flexible tube 8 and a bulb 9 for evacuation are attached. Insulator board 2 is connected to a board interconnection cable 6 extending from board connector 5 electrically connected to a tester (not shown).

Board interconnection cable 6 is directly connected to insulator board 2 but is not directly connected to probe card wafer 1, so that probe card wafer 1 can be more easily handled.

Figure 3:
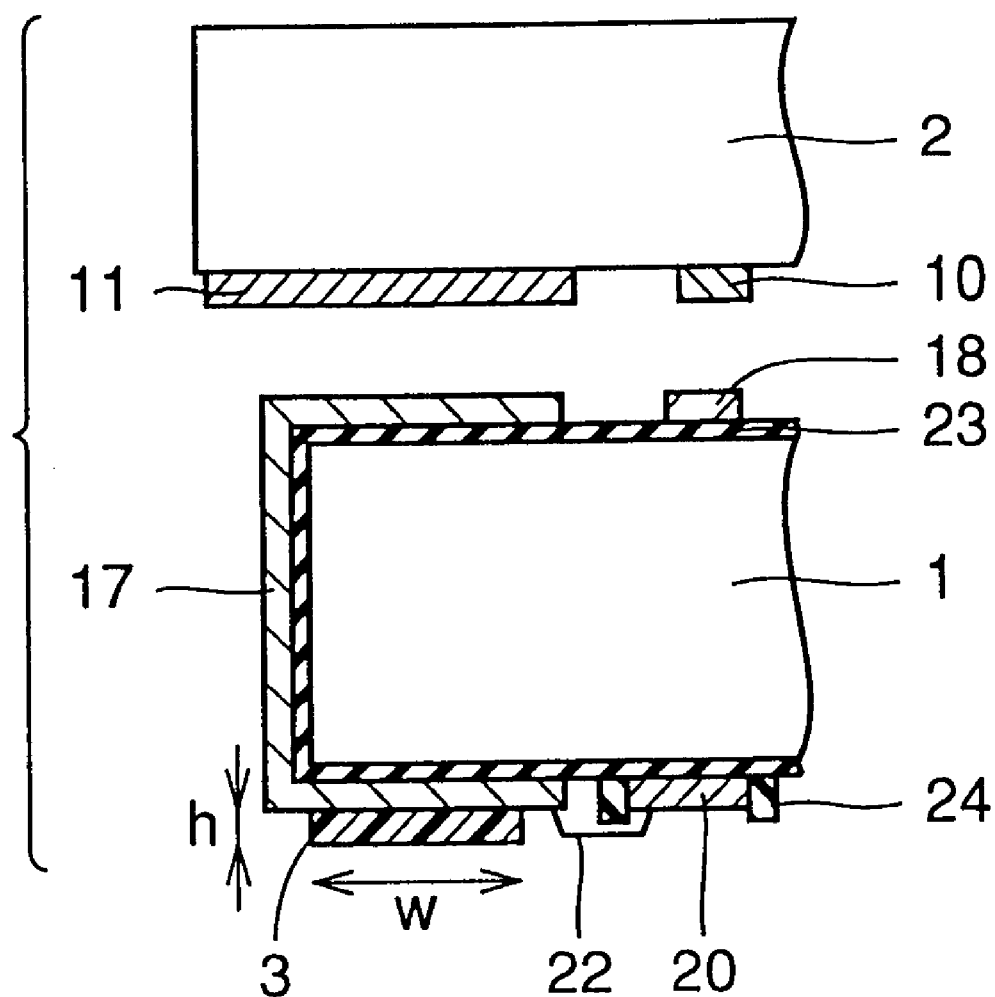
FIG. 3 is a partially enlarged, cross sectional view of part A in FIG. 2.
Figure 4:
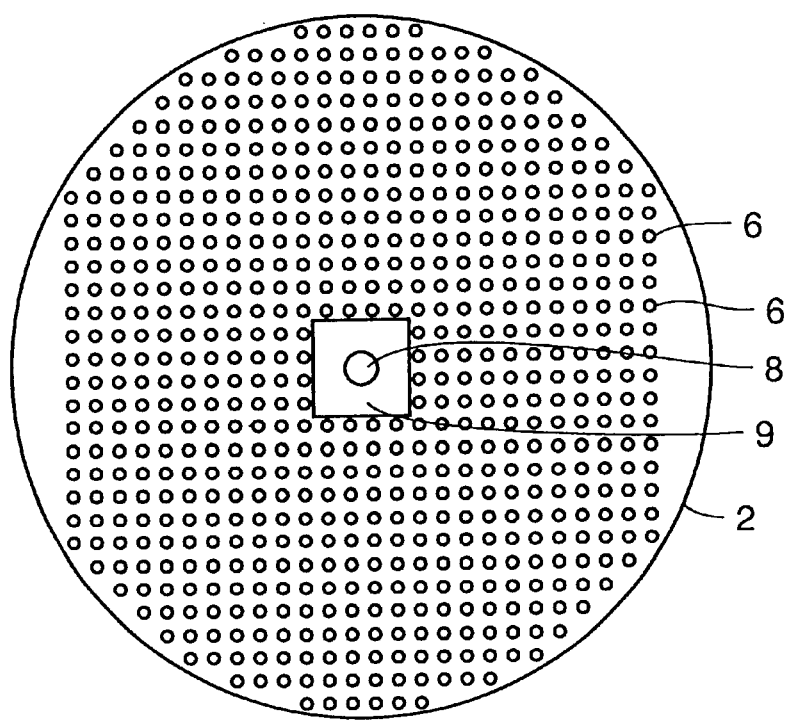
FIG. 4 is a plan view of an insulator board in the burn-in device according to the embodiment.
Figure 5:
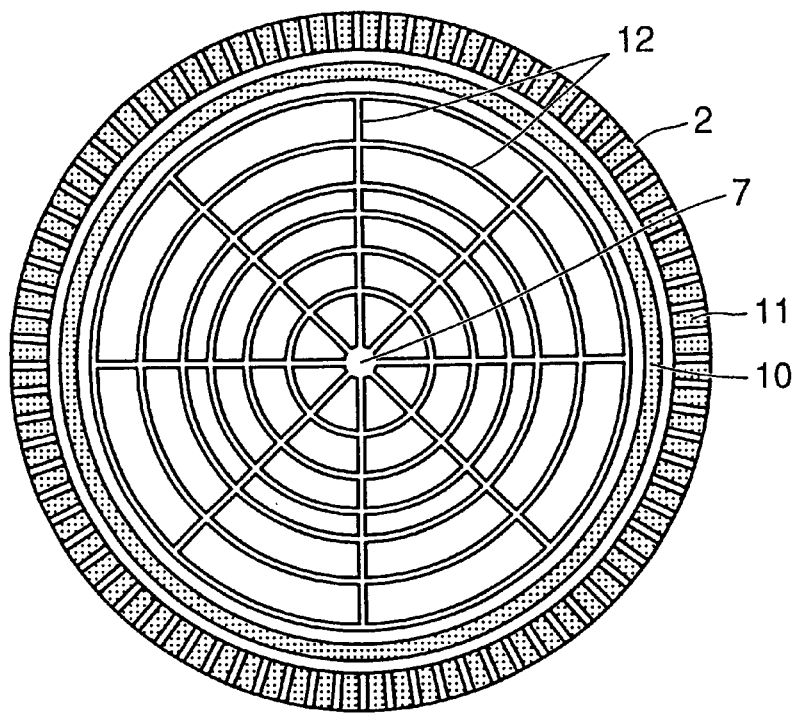
FIG. 5 is another plan view of the insulator board according to the embodiment.

Furthermore, as shown in FIGS. 3, 4 and 5, a ring-shaped board side electrode 10 is formed along the outer periphery on a surface of insulator board 2 on the side of probe card wafer 1. Ring-shaped board side electrode 10 is preferably formed at a distance of at most 10 mm from the edge of insulator board 2 and has a width of at least 100 µm.

A plurality of radial board side electrodes 11 electrically connected with board interconnection cable 6 are formed at the outer periphery of board side electrode 10. Board side electrodes 11 preferably have a length of at least 1 mm. A groove 12 for vacuum adsorption is formed on a surface of insulator board 2 surrounded by ring-shaped board side electrode 10.

Figure 6:
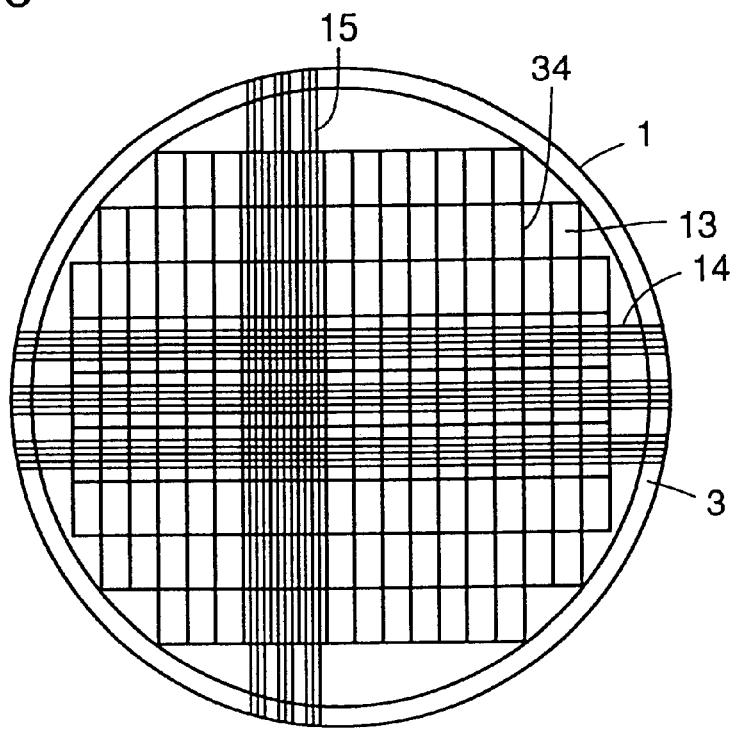
FIG. 6 is a plan view of a probe card wafer according to the embodiment.

As shown in FIG. 6, a plurality of burn-in units 13 partitioned by a dicing line 34 are formed on the surface of probe card wafer 1 on the side of wafer under test 4. A plurality of wafer through holes 16 passing through probe card wafer 1 are formed to be open in the region of dicing line 34. One or more such through holes are preferably formed each for 4 shots for burn-in unit 13.

A ring-shaped spacer 3 to hold wafer under test 4 by vacuum is formed along the outer periphery of probe card wafer 1. Spacer 3 is preferably formed in a region W at a distance of at most 5 mm from the outer edge of probe card wafer 1, and has a height h 10% to 15% greater than the height of bump 21.

Burn-in unit 13 is provided with bumps in contact with prescribed electrodes in a semiconductor device formed in wafer under test 4, and these bumps are electrically connected by interconnections 14 and 15 having a two-layer structure. By forming interconnections 14 and 15 into multiple layers, current sufficient to test the semiconductor device may be stably supplied. The flexibility of the pattern of burn-in unit 13 is also improved. In order to formed two-layer interconnections 14 and 15, at least three insulating films are preferably formed in burn-in unit 13.

Meanwhile, a wafer backside insulating film 23 is formed as a film to adjust the warp with wafer 4 under a burn-in test on the surface of probe card wafer 1 facing the surface wafer under test 4. The backside insulating film preferably has an insulating film the same as that formed on wafer under test 4 similarly to the case of wafer under test 4. If the size of warp of wafer under test 4 is available, an insulating film is preferably formed to have a prescribed thickness so that the warp of probe card wafer 1 will be the same as that of wafer under test 4.

Figure 7:
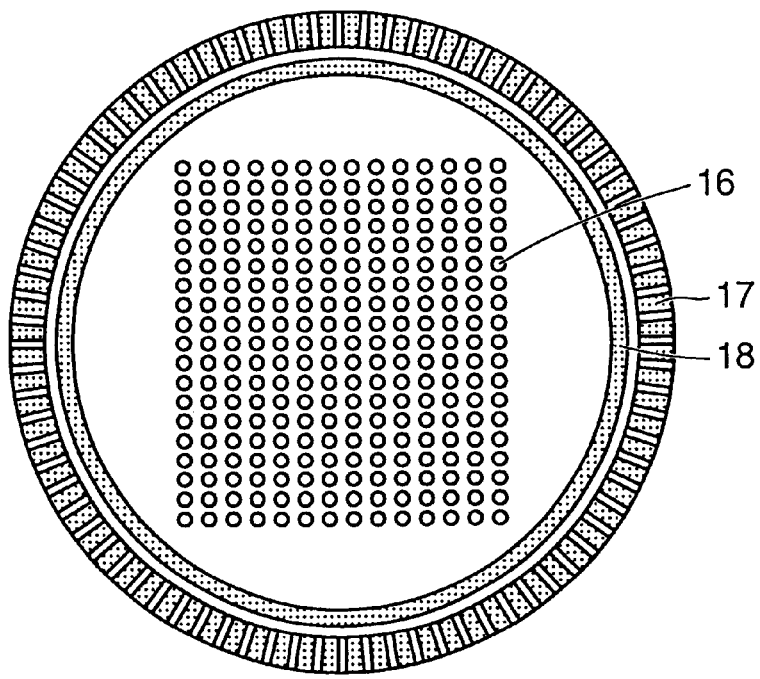
FIG. 7 is another plan view of the probe card wafer according to the embodiment.

As shown in FIG. 7, a ring-shaped wafer side electrode 18 is formed along the outer periphery of probe card wafer 1. A plurality of radial wafer side electrodes 17 are formed along the outer periphery of wafer side electrode 18. The width of ring-shaped wafer side electrode 18 is preferably at least 100 µm. The length of ring-shaped wafer side electrode 17 preferably has a length of at least 1 mm.

During a burn-in test, radial wafer side electrodes 17 are electrically connected with radial board side electrodes 11 formed in insulator board 2. Ring-shaped wafer side electrode 18 is electrically connected to ring-shaped board side electrode 10 formed in insulator board 2. Ring-shaped wafer side electrode 18 and board side electrode 10 are in contact with each other to serve as a seal member between probe card wafer 1 and insulting board 2.

Figure 8:
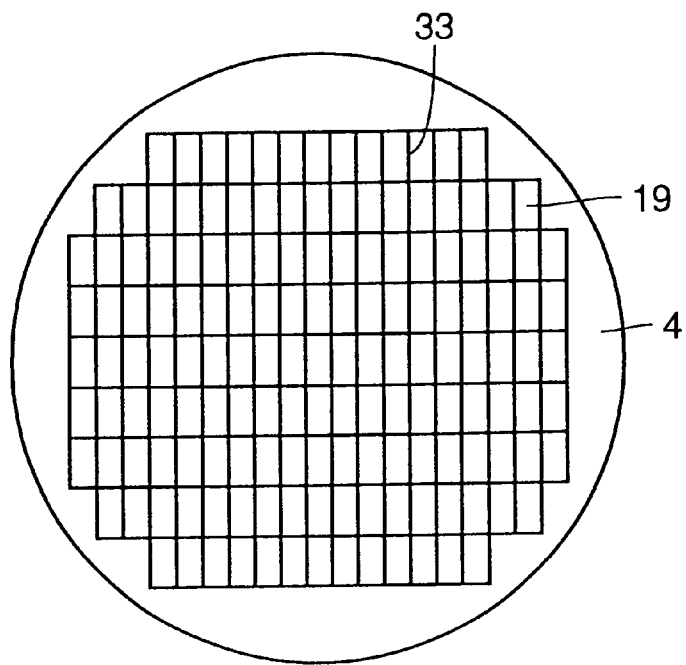
FIG. 8 is a plan view of a wafer under test.
Figure 9:
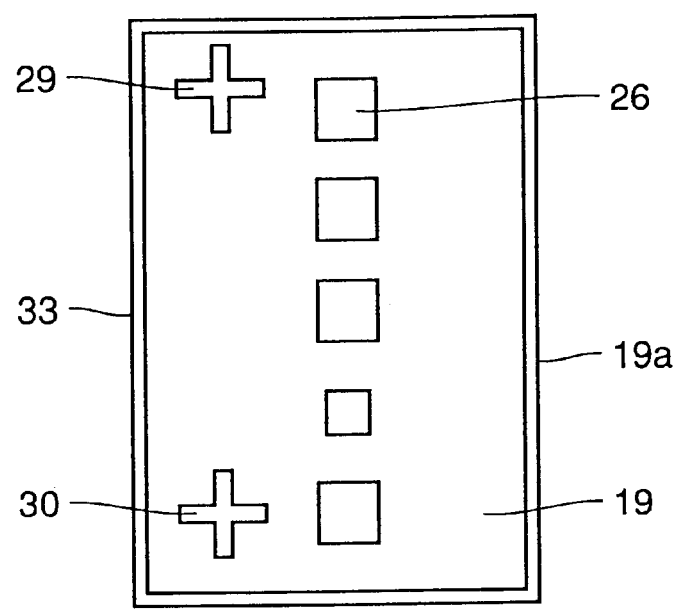
FIG. 9 is a pattern for one shot for a semiconductor device formed in a wafer under test.
Figure 10:
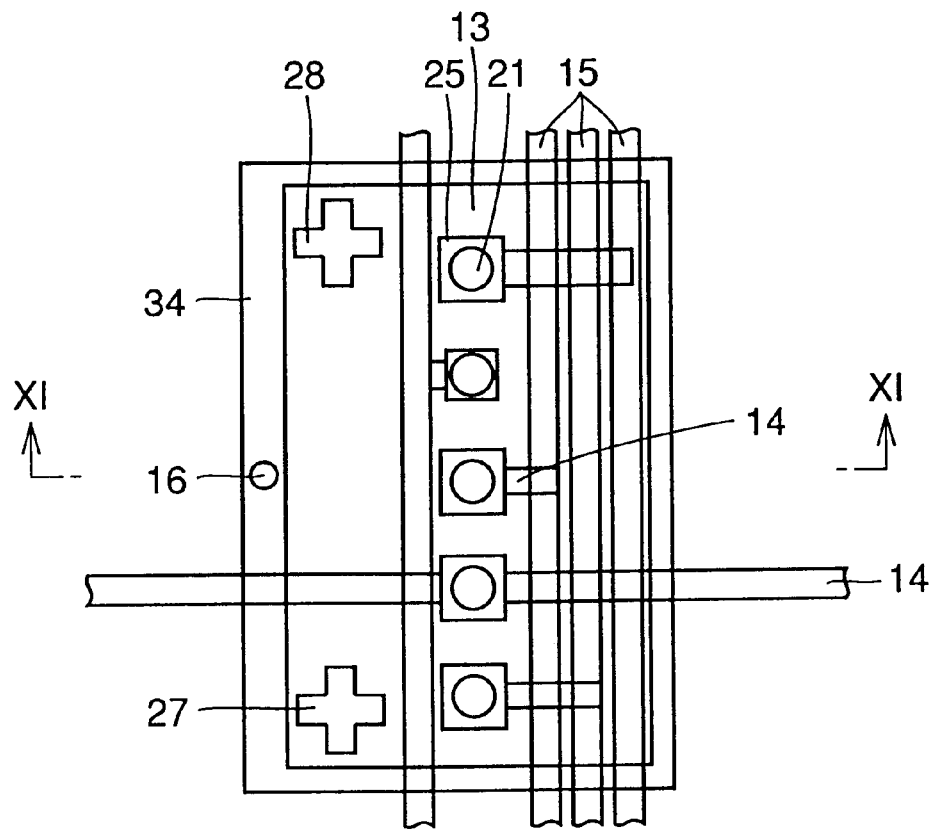
FIG. 10 is a pattern for one shot for a burn-in unit formed in a probe card wafer.
Figure 11:
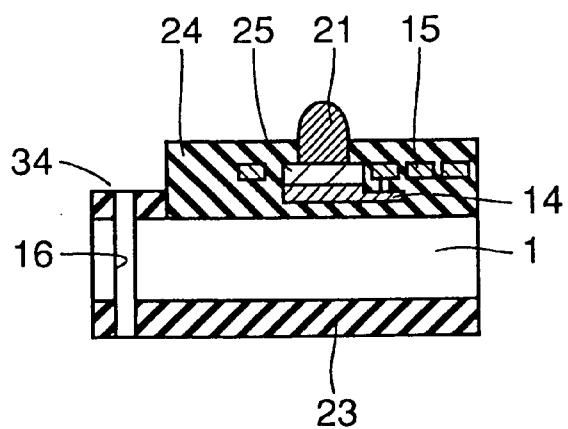
FIG. 11 is a cross sectional view taken along line XI—XI in FIG. 10.

Burn-in units 13 formed in probe card wafer 1 are formed corresponding to the patterns of a plurality of semiconductor devices formed in wafer under test 4 for example as shown in FIG. 8. If as shown in FIG. 9, a pattern for one shot of the plurality of semiconductor devices 19 formed in wafer under test 4 includes four pads 26 and two alignment marks 29 and 30, one shot for burn-in unit 13 includes at least bumps 21 in electrical contact with pads 26, and alignment marks 27 and 28 as shown in FIGS. 10 and 11.

Bumps 21 are formed on pads 25, and connected to prescribed interconnections 14 and 15. Pad 25 is preferably formed of the same layer as the overlying interconnection layer. The region of burn-in unit 13 except for pads 25 is preferably covered with a passivation film.

Furthermore, the two alignment marks 27 and 28 have a greater size than alignment marks 29 and 30 formed in the semiconductor device. The burn-in device according to this embodiment has the above construction.

The operation of the burn-in device described above will be now described. Probe card wafer 1 is provided at a prescribed position to oppose wafer under test 4, and insulator board 2 is provided to oppose wafer under test 4 through probe card wafer 1. The positioning of probe card wafer 1 will be later described in detail.

The bulb 9 of flexible tube 8 is opened. At this time, spacer 3 seals between probe card wafer 1 and wafer under test 4, and ring-shaped board side electrode 10 and wafer side electrode 18 seal between probe card wafer 1 and insulator board 2. Thus, wafer under test 4 is attached by vacuum to insulator board 2 through probe card wafer 1.

At this time, wafer through hole 16 is formed to be open in the region of dicing line 34, and therefore streaming resistance in evacuating the air between probe card wafer 1 and wafer under test 4 is relaxed. Similarly, groove 12 formed in insulator board 2 relaxes the streaming resistance in evacuating the space between insulator board 2 and probe card wafer 1. As a result, wafer under test 4 can be evenly adsorbed through probe card wafer 1.

By the above operations, bumps 21 in the burn-in unit formed in probe card wafer 1 are in contact with pads 26 in the semiconductor device formed in wafer under test 4. Bump 21 is electrically connected with board interconnection cable 6 connected to a tester (not shown) through interconnections 14, 15, wafer side electrodes 17, 18 and board side electrodes 10, 11.

The semiconductor device is then subjected to a burn-in test at raised temperatures. At this time, probe card wafer 1 is formed of the same material as that of wafer under test 4, and therefore the thermal expansion coefficients of probe card wafer 1 and wafer under test 4 are the same. Thus, bumps 21 formed in probe card wafer 1 and corresponding pads 26 formed in wafer under test 4 are not relatively shifted from one another. As a result bumps 21 are surely in contact with pad 26, which permits successful burn-in tests.

Since backside insulating film 23 is formed in probe card wafer 1, probe card wafer 1 curves according to the warp of wafer under test 4. As a result, the gap between wafer under test 4 and probe card wafer 1 is substantially constant within the surface of wafer under test 4. Therefore, bumps 21 are not departed from pads 26 and come surely into contact.

Furthermore, since bumps 21 in probe card wafer 1 are in contact with pads 26 in wafer under test 4, so that damages to pads 26 are significantly smaller than the conventional case of allowing a board needle to contact a pad. As a result, wire-bonding to pads 26 in the semiconductor device can be successfully achieved. In addition, a plurality of semiconductor devices formed on wafer under test 4 may be tested at a time, so that the testing efficiency is greatly improved.

In order to surely make bumps 21 and pads 26 contact, in addition to forming backside insulating film 23 in probe card wafer 1, the size of burn-in unit 13 formed in probe card wafer 1 is preferably different from the size of one shot for the semiconductor device formed in wafer under test 4.

Figure 12:
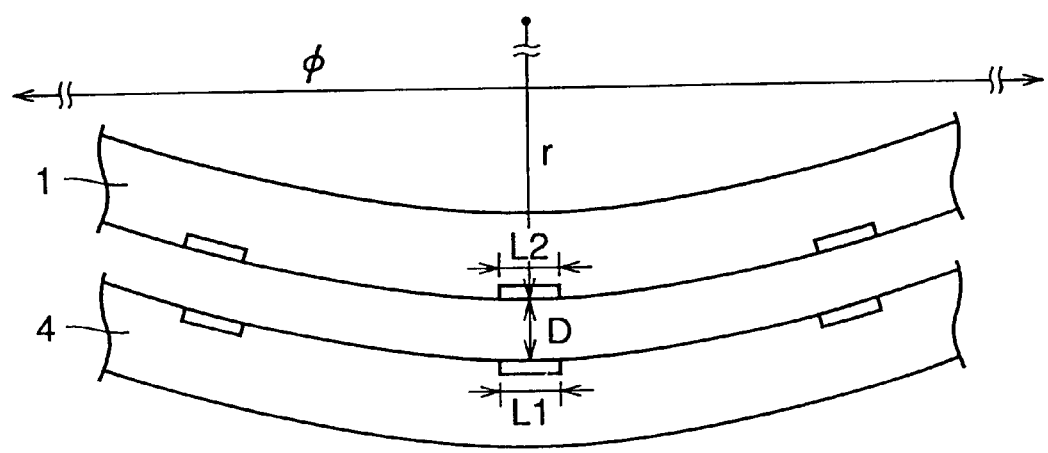
FIG. 12 is a cross sectional view showing the relation between the warps of a wafer under test and a burn-in unit.

As shown in FIG. 12, for example, if wafer under test 4 curves to be raised toward the side opposing the side of probe card wafer 1, the size L2 of one shot for burn-in unit 13 is preferably set smaller than the size L1 of one shot for the semiconductor device.

More specifically, if the radius of warp of the warp of probe card wafer 1 is r, and the distance between wafer under test 4 and probe card wafer 1 is d, the size L2 obtained from the expression $L2=r \cdot L1/(r+d)$ is preferably employed.

Meanwhile, if wafer under test 4 is formed to be recessed toward the side of probe card wafer 1, the value of L2 is preferably set greater than that of L1. More specifically, the size L2 obtained from the expression $L2=r \cdot L1/(r-d)$ is preferably employed.

By forming a burn-in unit having the above size L2 in probe card wafer 1, bumps 21 formed in probe card wafer 1 may be surely brought into contact with pads 26 formed in the semiconductor device in wafer under test 4. As a result, a burn-in test may be further successfully achieved. Note that in FIG. 12, φ represents the diameter of probe card wafer 1.

Figure 13:
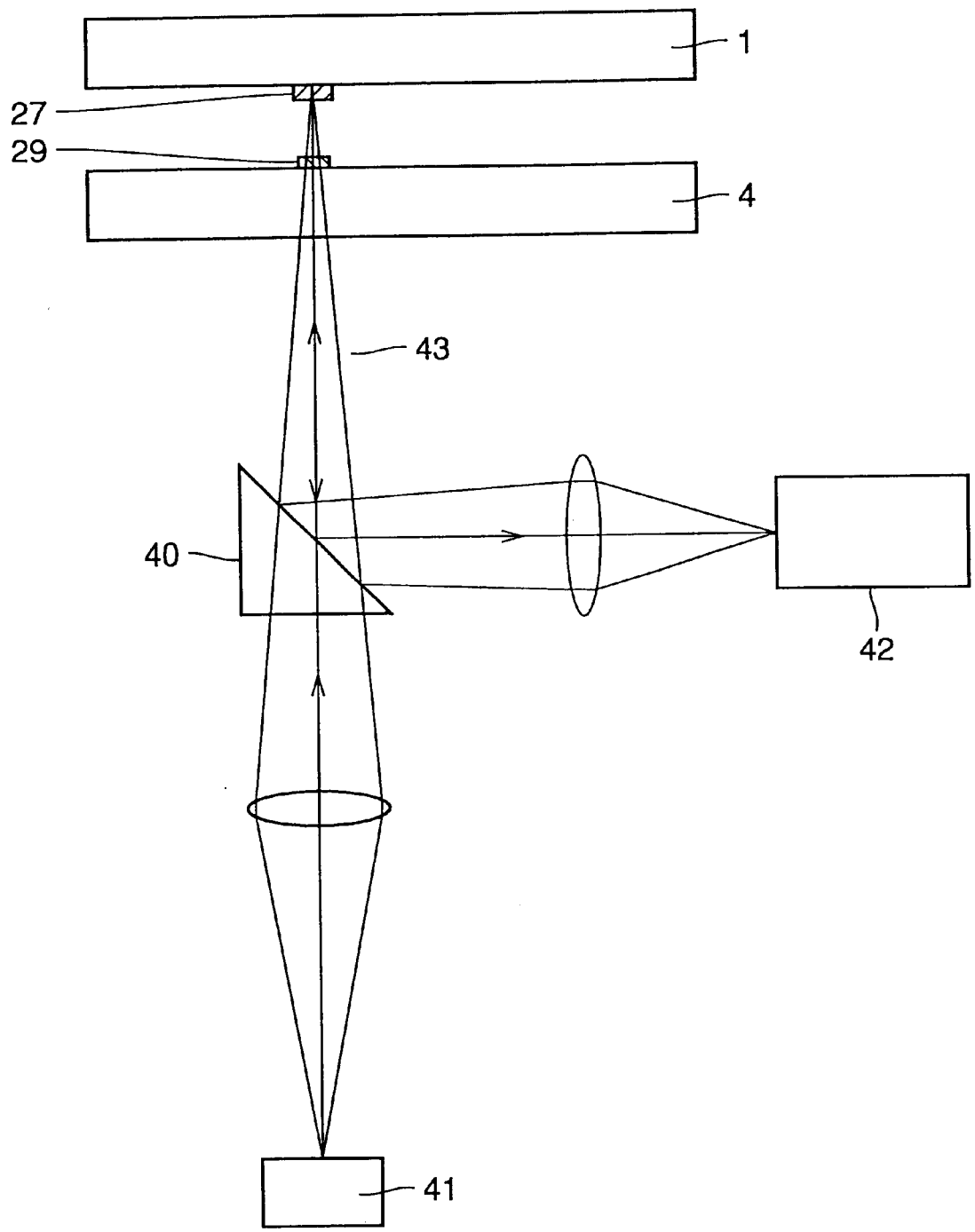
FIG. 13 is a diagram showing an optical arrangement for use in illustration of alignment in a probe card wafer.

An example of the method of positioning probe card wafer 1 will be now described in conjunction with the drawings. Referring to FIG. 13, an alignment mark 29 or the like is formed in wafer under test 4. Meanwhile, an alignment mark 27 having a larger size than alignment mark 29 is formed in probe card wafer 1. Wafer under test 4 is scanned with an infrared beam 43 emitted from an infrared source 41 from the side opposite to the side of probe card wafer 1.

If wafer under test 4 is for example a silicon substrate, infrared beam 43 is transmitted through the silicon substrate and reaches probe card wafer 1. If alignment mark 27 is located at the position the beam has reached, the infrared beam is reflected by alignment mark 27. The reflected infrared beam is transmitted through wafer under test 4 and reaches a detector 42 through a beam splitter 40.

The optimum positioning of probe card wafer 1 with respect to wafer under test 4 occurs when the center of alignment mark 27 and the center of alignment mark 29 are positioned on the optical axis of the infrared beam used for scanning. In this case, since alignment mark 27 is larger in size than alignment mark 29, the infrared beam reflected by alignment mark 27 is not shielded by alignment mark 29, and measured by detector 42. Then, as scanning is further performed with an infrared beam, the reflected infrared beam is shielded by alignment mark 29 and not measured. As the infrared beam is used for scanning, the reflected infrared beam is not shielded by alignment mark 29, and once again detected by detector 42.

Thus, the reflected infrared beam is detected by detector 42 and probe card wafer 1 is positioned to attain the above-described state, so that probe card wafer 1 may be more easily positioned.

The above-described method is effective the specific resistance of wafer under test 4 is relatively high, since the infrared beam is transmitted through wafer under test 4, but the method is not effective when the specific resistance is relatively low. More specifically the impurity concentration in the wafer under test is high and the specific resistance of the wafer under test is 1Ω·cm or lower, the reflected light cannot be successfully detected because of low transmittance of the infrared beam.

Figure 14:
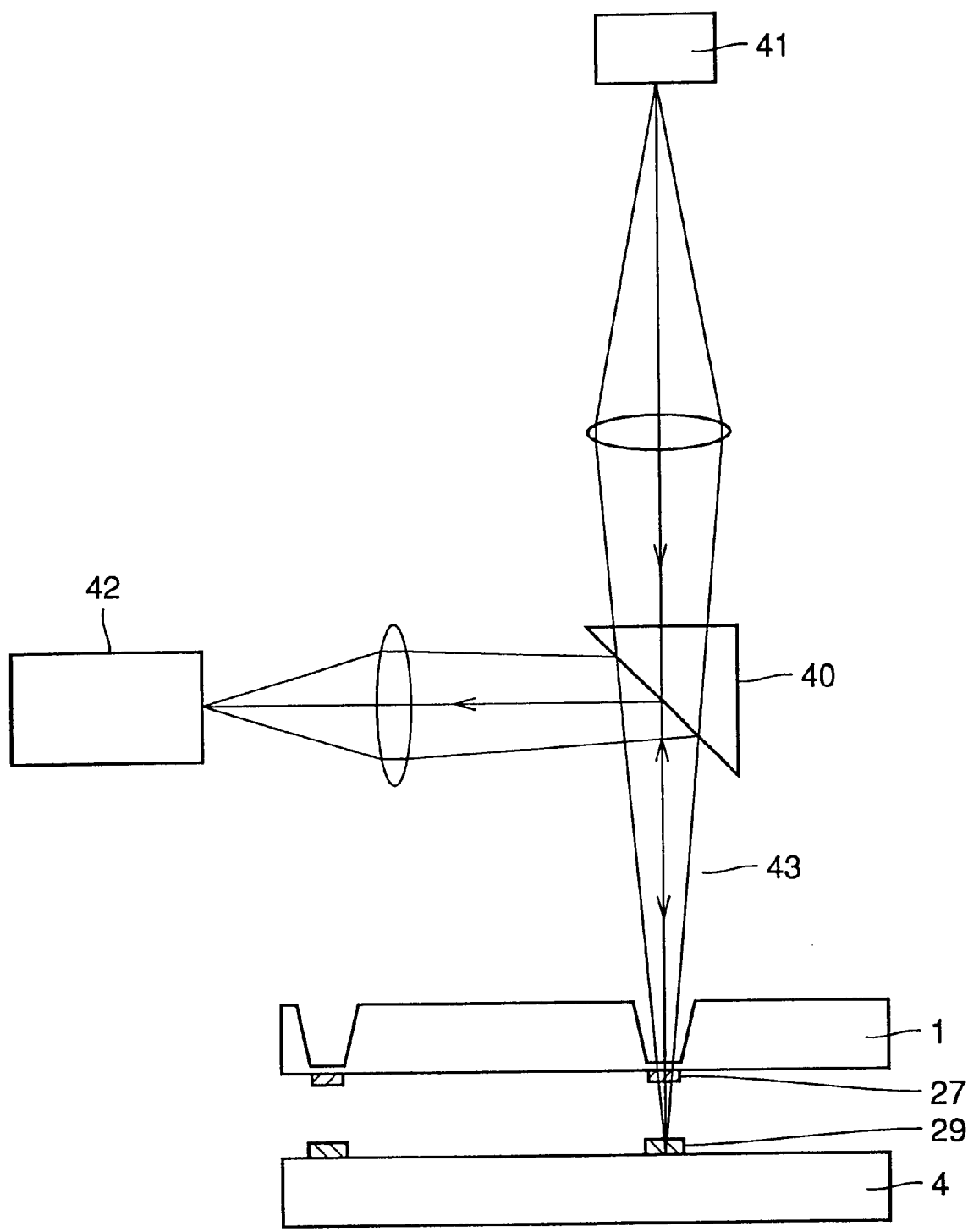
FIG. 14 is a diagram showing another optical arrangement for use in illustration alignment for a probe card wafer.

As another example of the method of positioning probe card wafer 1, positioning when the value of the specific resistance of wafer under test 4 is relatively low will be now described in conjunction with the drawings. In this case, as shown in FIG. 14, an infrared beam 43 is directed to wafer under test 4 from the side of probe card wafer 1 for scanning. Wafer under test 4 is therefore provided with an alignment mark 29 having a greater size than the size of an alignment mark 27 formed in probe card wafer 1.

At this time, the infrared beam is transmitted trough probe card wafer 1, therefore the surface of probe card wafer 1 particularly on the opposite side to the part having alignment mark 27 is preferably polished, and the thickness of the portion is preferably not more than about 100 μm. Particularly in this case, the part having an alignment mark formed using an SOI wafer as the probe card wafer can be readily thinned.

Similarly to the case shown in FIG. 13, the infrared beam reflected by alignment mark 29 is not shielded by alignment mark 27, and measured by a detector 42, while the reflected infrared beam by scanning is shielded by alignment mark 27 and cannot be measured. As the infrared beam further scans, the reflected infrared beam is not shielded by alignment mark 27 and once again detected by detector 42. The positioning of probe card wafer 1 is determined by detecting this state.

Note that in the former method, alignment mark 27 is preferably formed of a material having high reflectivity to the infrared beam such as aluminum. Alignment mark 29 is preferably formed of a material opaque to the wavelength region of the infrared beam, such as titanium nitride.

Meanwhile, conversely in the latter method, alignment mark 27 is preferably formed of a material opaque to the wavelength region of an infrared beam, and alignment mark 29 is formed of a material having high reflectivity to the infrared beam.

Second Embodiment

A burn-in device according to a second embodiment will be now described in conjunction with the accompanying drawings. According to the first embodiment, radial wafer side electrodes 17 formed in probe card wafer 1 are formed continuously from one surface of probe card wafer 1 via its periphery to the other surface as shown in FIG. 3.

Wafer side electrodes 17 cannot be formed easily at the periphery of probe card wafer 1, and if formed, the electrodes could easily come off. This embodiment is related to a burn-in device including a probe card wafer directed to a solution to the problem.

Figure 15:
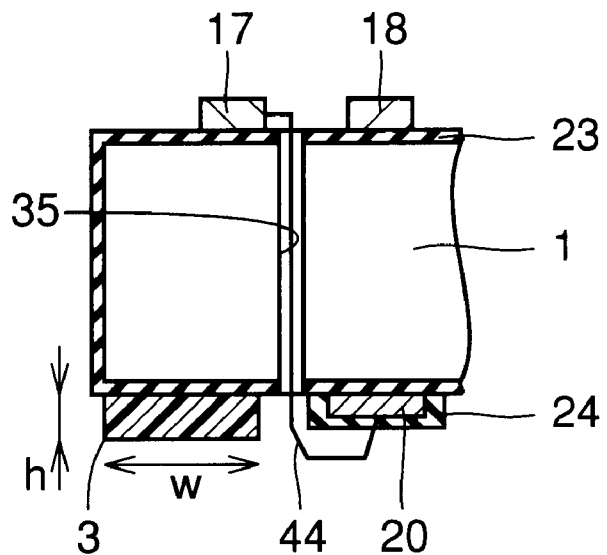
FIG. 15 is a partially enlarged, cross sectional view of a probe card wafer in a burn-in device according to a second embodiment of the present invention.

As shown in FIG. 15, at the outer periphery of probe card wafer 1, a through hole 35 passing through from one side to the other side is formed. Radial wafer side electrodes 17 are formed only on the surface opposing insulator board 2. Wafer side electrodes 17 and outer periphery pads 20 are electrically connected by a wire 44 passed through through hole 35. Note that wire 44 is coated with insulator.

The use of the above probe card wafer 1 permits sure electrical connection between the wafer side electrodes and outer periphery pads and radial wafer side electrodes 17 can be readily formed.

Third Embodiment

In probe card wafer 1 described in conjunction with the second embodiment, wire 44 is connected to radial wafer side electrode 17. Wafer side electrode 17 is in contact with radial board side electrode 11 formed in insulator board 2, and wire 44 could be cut off.

Figure 16:
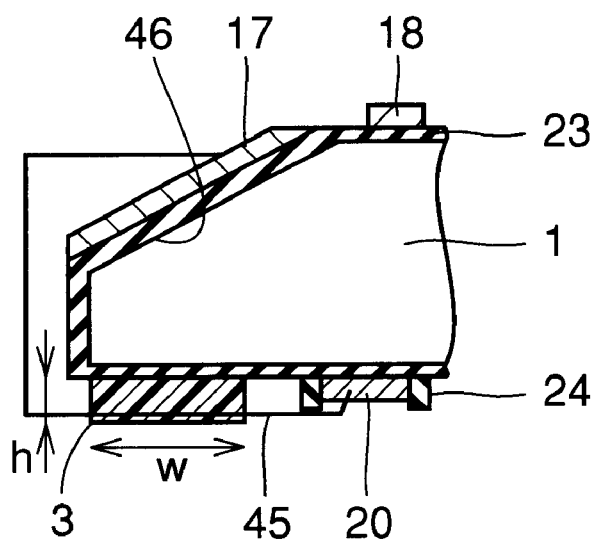
FIG. 16 is a partially enlarged, cross sectional view of a probe card wafer in a burn-in device according to a third embodiment of the present invention.
Figure 17:
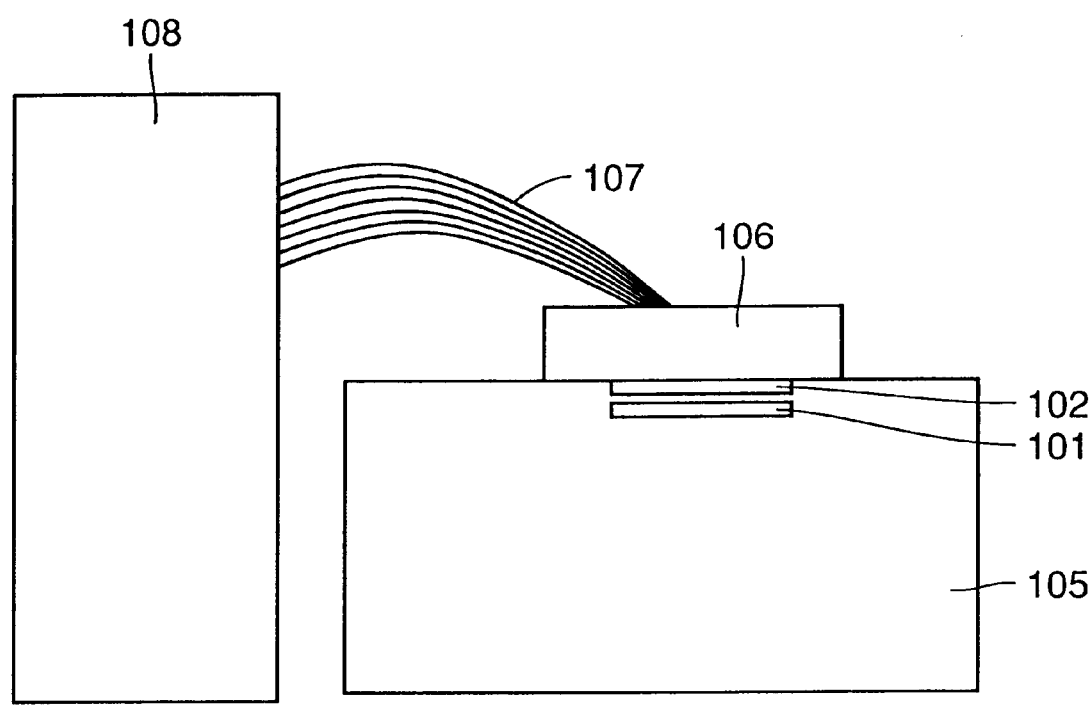
FIG. 17 is a diagram showing the construction of a conventional burning unit.
Figure 18:
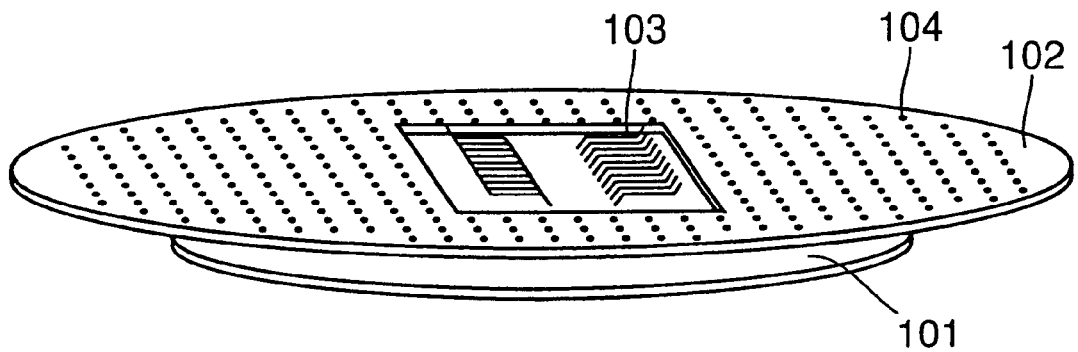
FIG. 18 is a perspective view showing the relation between a burn-in board and a semiconductor substrate under test.
Figure 19:
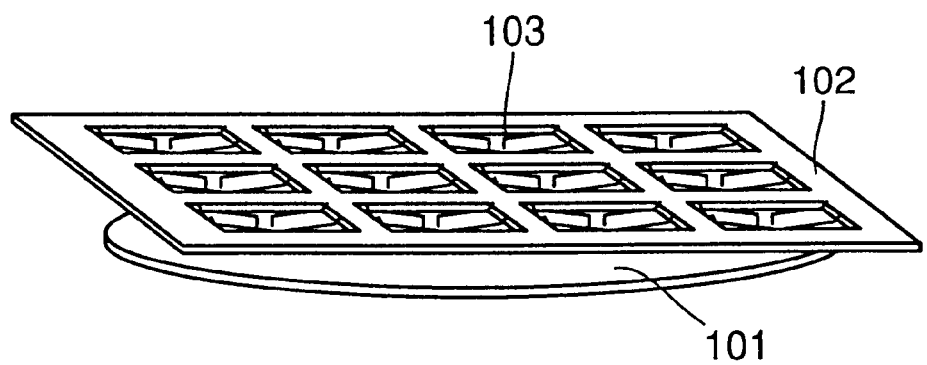
FIG. 19 is another perspective view showing the relation between a burn-in board and a semiconductor substrate under test in a conventional burn-in unit.

According to this embodiment, a burn-in device having a probe card wafer directed to a solution to this problem will be described. As shown in FIG. 16, at the outer periphery of the surface opposing the insulator board 2 of probe card wafer 1, a tapered surface 46 is formed. Radial wafer side electrodes 17 are formed on tapered surface 46. Wafer side electrodes 17 and outer peripheral pads 20 are electrically connected by a wire 45.

Thus, when board side electrode 11 formed in insulator board 2 and wafer side electrode 18 formed in probe card wafer 1 are brought into contact, the part of wafer side electrode 17 at which wire 45 is connected is not directly contacted to the insulator board so that wire 45 is not cut off at the bonding portion. As a result, a burn-in test can be more successfully conducted.

Fourth Embodiment

A burn-in device according to a fourth embodiment of the present invention will be described. If probe card wafer 1 is a silicon wafer, an active element such as transistor other than the wire can be formed in a burn-in unit by the same manufacturing steps as those of wafer under test 4.

A burn-in device according to this embodiment as in the following description includes a probe card wafer having a burn-in unit in which a power supply generating circuit for use in testing, a clock signal generating circuit to generate a clock signal, a BIST (Built In Self Test) circuit to obtain failure information on a semiconductor device and a counter circuit. If a semiconductor device formed in a wafer under test operates with an internal power supply voltage different from an externally supplied voltage, a wide range of current must be supplied at the time of burn-in. In this case, since the power supply generating circuit is formed and therefore the current supply capability can be supplemented in the internal power supply generating circuit in the semiconductor device using the power supply generating circuit if the capability is not enough. Externally provided controlled voltage permits a failure at a particular part of the semiconductor device to be quickly found out.

The clock signal generating circuit can generate a high speed (not less than 100 MHz) clock signal so that the semiconductor device can operate at a high speed and a semiconductor device with the possibility of causing initial failures can be more quickly found out and removed.

Since the BIST circuit and counter circuit are formed, information on parts of the semiconductor device with faults or data related to the percentage of faults can be obtained, which makes easier the quality control of the semiconductor devices.

The material of spacer 3 provided in probe card wafer 1 according to any of the above embodiments may be silicon resin, silicon-degenerated epoxy resin.

In any of the above embodiments, the wafer under test is a silicon substrate by way of illustration, but a wafer of gallium arsenide (GaAs) and silicon germanium (SiGe) may be used.

In this case, a wafer of gallium arsenide or silicon germanium may be used as a probe card wafer to make the expansion coefficients of the wafer under test and the probe card wafer the same. As a result, the probe electrodes formed in the probe card wafer and the pads in the semiconductor device will not be shifted from each other, and the same effects as those described in conjunction with the first embodiment may be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A probe card device for testing a plurality of semiconductor devices formed on a substrate under test, comprising:

a probe substrate adapted to be provided opposing the substrate under test and formed of the same material as that of the substrate under test, said probe substrate having a plurality of probe electrodes adapted to be in electrical contact with the semiconductor devices, said probe substrate comprising:

a first seal member provided on a surface of said probe substrate which opposes the substrate under test during testing to hold the substrate under test by vacuum and seal between the substrate under test and said probe substrate, wherein said first seal member is adapted to directly contact said substrate under test during testing; and a substrate through hole passed through said probe substrate for evacuation.

2. The probe card device according to claim 1, wherein a film to adjust the warp of said probe substrate to the warp of the substrate under test at the time of testing is formed on the other surface of said probe substrate opposing said one surface.

3. The probe card device according to claim 1, wherein said probe electrode formed in said probe substrate includes a bump electrode.

4. The probe card device according to claim 1, wherein said first seal member formed in said probe substrate includes a ring-shaped insulating film formed along the outer periphery of said probe substrate.

5. The probe card device according to claim 1, wherein said first seal member engages said substrate under test.

6. The probe card device according to claim 1, wherein said substrate through hole is positioned between two of said plurality of probe electrodes.

7. The probe card device according to claim 1, wherein said first seal member is adapted to be positioned between the probe substrate and the substrate under test.

8. The probe card device according to claim 1, wherein said probe substrate is provided with at least two substrate side alignment marks corresponding to alignment marks formed in the semiconductor device.

9. The probe card device according to claim 8, wherein the size of said substrate side alignment mark and the size of the alignment mark formed in the semiconductor device are different, between said substrate side alignment mark and the alignment mark formed in the semiconductor device, an alignment mark larger in size is formed of a material which reflects infrared radiation, and the alignment mark smaller in size is formed of a material opaque or semitransparent to infrared radiation.

10. The probe card device according to claim 1, wherein a plurality of patterns partitioned by a dicing line are formed on said one surface of said probe substrate, and said substrate through hole is formed in a region of said dicing line.

11. The probe card device according to claim 10, wherein the size of one shot of said pattern is different from the size of one shot of the semiconductor device formed on the substrate under test.

12. The probe card device according to claim 10, wherein said pattern is provided with at least two interconnection layers.

13. The probe card device according to claim 10, wherein said pattern includes a prescribed circuit pattern for use in testing the substrate under test, said prescribed circuit pattern includes a power supply generating circuit to supply current to a semiconductor device, a clock signal generating circuit to generate a clock signal, a test circuit to test a semiconductor device, and a counter circuit to handle data related to a fault of the semiconductor device.

14. The probe card device according to claim 1, further comprising an insulator board provided opposing said the other surface of said probe substrate, wherein a second seal member provided on at least one of the opposing surfaces of said insulator board and said probe substrate to seal between said probe substrate and said insulting board in order to adsorb by vacuum said probe substrate and said substrate under test, and said insulator board has a board through hole to evacuate the substrate under test through said substrate through hole.

15. The probe card device according to claim 14, wherein a groove is formed in the surface of said insulator board surrounded by said second seal member.

16. The probe card device according to claim 14, wherein said second seal member includes:

a substrate side ring-shaped electrode formed along the outer periphery of said probe substrate; and a board side ring-shaped electrode formed at said insulator board and in contact with said substrate side ring-shaped electrode.

17. The probe card device according to claim 14, wherein said probe substrate has a substrate side electrode in electrical connection with said probe electrode, and said insulator board has a board side electrode in contact with said substrate side electrode.

18. The probe card device according to claim 17, wherein a plurality of said substrate side electrodes are radially formed along the outer periphery of said probe substrate, and a plurality of said board side electrodes are radially formed along the outer periphery of said insulator board.

19. The probe card device according to claim 18, wherein said substrate side electrodes are continuously formed from one surface of said probe substrate via the periphery to the other surface.

20. The probe card device according to claim 18, wherein said substrate side electrode is electrically connected with a cable coated with an insulator, and said insulator-coated cable is electrically connected with said probe electrode through a through hole formed at the outer periphery of said probe substrate.

21. The probe card device according to claim 18, wherein a tapered surface is provided at the outer periphery of said probe substrate on said insulator board side, said substrate side electrode is formed at the tapered surface, and a wire is bonded to said substrate side electrode, said wire being in electrical connection with said probe electrode.

* * * * *